United States Patent
Yu

(10) Patent No.: US 11,903,268 B2
(45) Date of Patent: Feb. 13, 2024

(54) DISPLAY SUBSTRATE, PREPARATION METHOD AND BRIGHTNESS COMPENSATION METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventor: Tiancheng Yu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/630,150

(22) PCT Filed: Mar. 24, 2021

(86) PCT No.: PCT/CN2021/082770
§ 371 (c)(1),
(2) Date: Jan. 25, 2022

(87) PCT Pub. No.: WO2021/227672
PCT Pub. Date: Nov. 18, 2021

(65) Prior Publication Data
US 2022/0285473 A1    Sep. 8, 2022

(30) Foreign Application Priority Data

May 11, 2020 (CN) .......................... 202010391475.3

(51) Int. Cl.
*G09G 3/00* (2006.01)
*H10K 59/13* (2023.01)
(Continued)

(52) U.S. Cl.
CPC ............... *H10K 59/13* (2023.02); *G09G 3/03* (2020.08); *G09G 3/3225* (2013.01); *H10K 30/82* (2023.02);
(Continued)

(58) Field of Classification Search
CPC ........... H10K 59/13; G09G 2320/0233; G09G 2360/148; G09G 2360/16
See application file for complete search history.

(56) References Cited

U.S. PATENT DOCUMENTS

| | | |
|---|---|---|
| 2004/0031966 A1 | 2/2004 | Forrest et al. |
| 2007/0236428 A1 | 10/2007 | Tseng et al. |

(Continued)

FOREIGN PATENT DOCUMENTS

| | | |
|---|---|---|
| CN | 107464529 A | 12/2017 |
| CN | 108428721 A | 8/2018 |

(Continued)

OTHER PUBLICATIONS

Office Action dated Aug. 3, 2022 for Chinese Patent Application No. 202010391475.3 and English Translation.

(Continued)

*Primary Examiner* — Kevin M Nguyen
(74) *Attorney, Agent, or Firm* — Ling Wu; Stephen Yang; Ling and Yang Intellectual Property

(57) ABSTRACT

A display substrate, a preparation method and a brightness compensation method therefor, and a display apparatus are provided. The display substrate includes a drive structure layer disposed on a substrate, a light-emitting element disposed on the drive structure layer, and a light detection unit which is disposed on the light-emitting element and is configured to detect the brightness of the light-emitting element, wherein the drive structure layer includes a pixel drive circuit, the light-emitting element includes a first (Continued)

electrode, an organic functional layer and a second electrode which are stacked on the drive structure layer, and the first electrode is connected to the pixel drive circuit; and the light detection unit includes a third electrode, a photosensitive active layer and a fourth electrode which are stacked.

17 Claims, 8 Drawing Sheets

(51) Int. Cl.
| | | |
|---|---|---|
| G09G 3/3225 | (2016.01) | |
| H10K 30/82 | (2023.01) | |
| H10K 50/828 | (2023.01) | |
| H10K 71/00 | (2023.01) | |
| H10K 59/35 | (2023.01) | |
| H10K 59/12 | (2023.01) | |
| H10K 77/10 | (2023.01) | |
| H10K 102/00 | (2023.01) | |

(52) U.S. Cl.
CPC ........... *H10K 50/828* (2023.02); *H10K 71/00* (2023.02); *G09G 2300/0426* (2013.01); *G09G 2320/0233* (2013.01); *G09G 2360/147* (2013.01); *G09G 2360/16* (2013.01); *H10K 59/1201* (2023.02); *H10K 59/351* (2023.02); *H10K 77/111* (2023.02); *H10K 2102/311* (2023.02)

(56) References Cited

U.S. PATENT DOCUMENTS

| | | | |
|---|---|---|---|
| 2010/0118003 A1* | 5/2010 | Yamashita | G09G 3/3233 |
| | | | 345/205 |
| 2011/0221720 A1 | 9/2011 | Kuo et al. | |
| 2014/0320553 A1 | 10/2014 | Eom et al. | |
| 2015/0221706 A1* | 8/2015 | Udaka | H10K 39/32 |
| | | | 257/40 |
| 2019/0013368 A1* | 1/2019 | Chung | H10K 59/351 |
| 2019/0251929 A1* | 8/2019 | Fossati | G09G 5/02 |
| 2019/0393271 A1* | 12/2019 | So | H10K 65/00 |
| 2020/0044003 A1* | 2/2020 | Cho | G09F 9/30 |
| 2020/0111851 A1* | 4/2020 | Park | G06F 3/0412 |
| 2020/0410918 A1 | 12/2020 | Gai et al. | |

FOREIGN PATENT DOCUMENTS

| | | |
|---|---|---|
| CN | 109378333 A | 2/2019 |
| CN | 109976450 A | 7/2019 |
| CN | 110047906 A | 7/2019 |
| CN | 110518044 A | 11/2019 |
| CN | 110634929 A | 12/2019 |
| CN | 111540775 A | 8/2020 |
| JP | 2007-266600 A | 10/2007 |

OTHER PUBLICATIONS

International Search Report for PCT/CN2021/082770 dated Jun. 30, 2021.

* cited by examiner

DISPLAY SUBSTRATE, PREPARATION METHOD AND BRIGHTNESS COMPENSATION METHOD THEREFOR, AND DISPLAY APPARATUS

CROSS-REFERENCE TO RELATED APPLICATIONS

The present application is a U.S. National Phase Entry of International Application No. PCT/CN2021/082770 having an international filing date of Mar. 24, 2021, which claims priority of Chinese Patent Application No. 202010391475.3, filed to the CNIPA on May 11, 2020 and entitled "Display Substrate, Preparation Method and Brightness Compensation Method Therefor, and Display Apparatus". The entire contents of the above-identified applications are hereby incorporated by reference.

TECHNICAL FIELD

Embodiments of the present disclosure relate to, but are not limited to, the field of display technology, and particularly relate to a display substrate, a preparation method and a brightness compensation method therefor, and a display apparatus.

BACKGROUND

In recent years, an application range of Active-Matrix Organic Light-Emitting Diode (AMOLED) display technology has been expanded increasingly. For some foldable display products with a main screen and a secondary screen, such as foldable mobile phones, foldable notebook computers, etc., due to different frequency of use of the main screen and the secondary screen by different consumers, brightness attenuation of the main screen and the secondary screen becomes different. In an unfolded screen state, brightness of the main screen and the secondary screen will be significantly different, which will seriously affect the display effect in the unfolded screen state. Some brightness compensation strategies are to monitor electrical characteristics of light-emitting elements of the main screen and the secondary screen, deduce a difference in optical brightness parameters through a difference in the electrical characteristics, and then compensate a differential brightness attenuation trend of the main screen and the secondary screen. However, such a method for detecting indirectly the difference in brightness attenuation between the main screen and the secondary screen is not accurate.

SUMMARY

The following is a summary about the subject matter described in the present disclosure in detail. The summary is not intended to limit the scope of protection of the claims.

An embodiment of the present disclosure provides a display substrate, which includes a drive structure layer disposed on a substrate, a light-emitting element disposed on the drive structure layer, and a light detection unit disposed on the light-emitting element and configured to detect brightness of the light-emitting element; the drive structure layer includes a pixel drive circuit, the light-emitting element includes a first electrode, an organic functional layer and a second electrode which are stacked on the drive structure layer, and the first electrode is connected with the pixel drive circuit; and the light detection unit includes a third electrode, a photosensitive active layer and a fourth electrode which are stacked.

An embodiment of the present disclosure further provides a display apparatus, which includes the display substrate described above.

An embodiment of the present disclosure further provides a preparation method for a display substrate, including: forming a drive structure layer on a substrate, wherein the drive structure layer includes a pixel drive circuit; forming a light-emitting element on the drive structure layer, wherein the light-emitting element includes a first electrode, an organic functional layer and a second electrode which are stacked on the drive structure layer, and the first electrode is connected with the pixel drive circuit; and forming a light detection unit on the light-emitting element, wherein the light detection unit is configured to detect brightness of the light-emitting element, and the light detection unit includes a third electrode, a photosensitive active layer and a fourth electrode which are stacked.

An embodiment of the present disclosure provides a brightness compensation method for a display substrate which includes a plurality of display regions, the method including: collecting brightness information of each display region; and comparing the brightness information of the plurality of display regions, and compensating brightness of a corresponding display region according to a comparison result.

After reading and understanding the drawings and the detailed description, other aspects may be understood.

BRIEF DESCRIPTION OF DRAWINGS

The drawings are used to provide a further understanding of the technical solution of the present disclosure, constitute a part of the description, are used together with the embodiments of the present disclosure to explain the technical solution of the present disclosure, and do not constitute limitations to the technical solution of the present disclosure.

DETAILED DESCRIPTION

The technical solution of the present disclosure will be described below with reference to the accompanying drawings and through the embodiments. It may be appreciated that the embodiments described herein are merely illustrative of the present disclosure and do not limit the present disclosure.

An embodiment of the present disclosure provides a display substrate, which includes a drive structure layer disposed on a substrate, a light-emitting element disposed on the drive structure layer, and a light detection unit disposed on the light-emitting element and configured to detect brightness of the light-emitting element; the drive structure layer includes a pixel drive circuit, the light-emitting element includes a first electrode, an organic functional layer and a second electrode which are stacked on the drive structure layer, and the first electrode is connected with the pixel drive circuit; the light detection unit includes a third electrode, a photosensitive active layer and a fourth electrode which are stacked.

In some exemplary embodiments, the third electrode is connected with the second electrode.

In some exemplary embodiments, the second electrode and the third electrode are an integrated structure.

In some exemplary embodiments, the display substrate further includes a capping layer disposed between the second electrode and the third electrode, and the third electrode is disposed on the capping layer; the third electrode is connected with the second electrode through a via opened on the capping layer, or the third electrode is connected with a low voltage line in a peripheral region of the display substrate.

Figure 1:
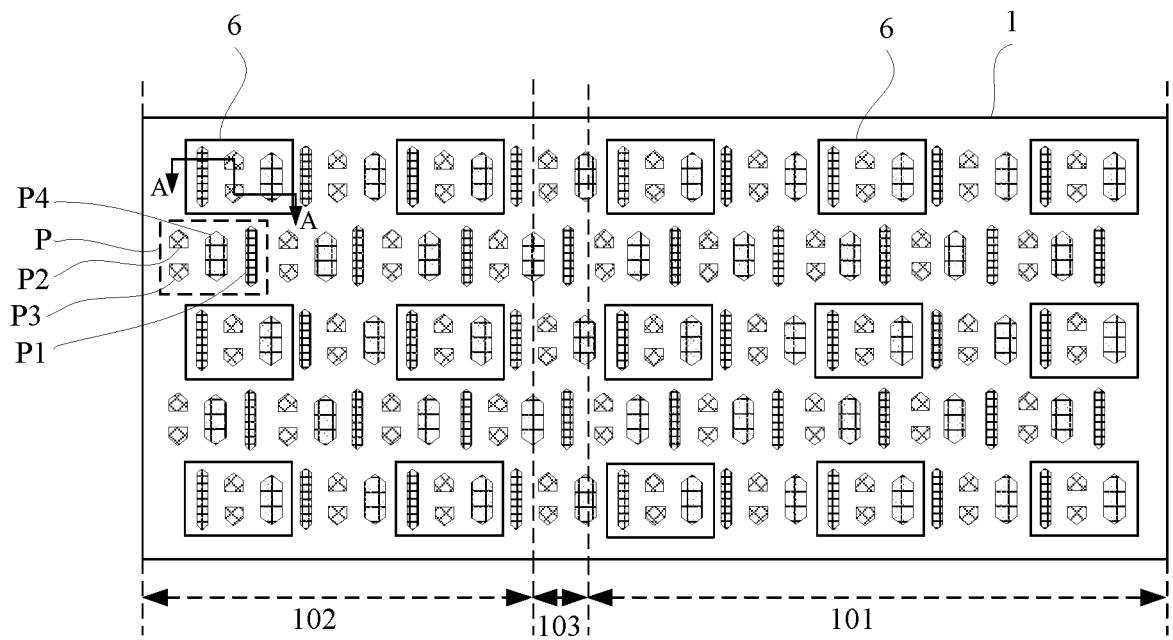
FIG. 1 is a schematic plan view of a structure of a display substrate according to some exemplary embodiments.

In some exemplary embodiments, as shown in FIG. 1, FIG. 1 shows a plan view of a foldable display substrate, which includes a first display region 101, a second display region 102, and a bending region 103 located between the first display region 101 and the second display region 102. The first display region 101 may be a main screen region (in use state when a foldable display product is unfolded and folded), and the second display region 102 may be a secondary screen region (in use state only when the foldable display product is unfolded). The first display region 101, the second display region 102 and the bending region 103 may be an integrated structure, which is an integrated display region in an unfolded screen state. The display substrate includes multiple pixel units P disposed in an array arrangement, and the pixel units P are also referred to as pixel points of a display image. Each pixel unit P may include multiple sub-pixels, and light emitted by the multiple sub-pixels may be mixed with each other to obtain different colors, so that each pixel unit P can display various colors (for example, white). In some examples, each pixel unit P may include four sub-pixels, which are a first sub-pixel P1 emitting red light, a second and third sub-pixels P2 and P3 emitting green light, and a fourth sub-pixel P4 emitting blue light. In other examples, the pixel unit P may include three sub-pixels that emit red light, green light and blue light respectively, or the pixel unit P may include four sub-pixels that emit red light, green light, blue light and white light respectively. In the present embodiment, the number, type and arrangement of sub-pixels of the pixel unit P are not limited. In the following description, the sub-pixels emitting light of the same color in the display substrate will be referred to as sub-pixels of the same color.

In some exemplary embodiments, light detection units 6 are disposed in regions where some pixel units P within the first display region 101 and the second display region 102 are located. In some examples, according to a size of a display region, there may be three to twelve light detection units 6 in each display region. For example, in FIG. 1, nine light detection units 6 are shown in the first display region 101 and six light detection units 6 are shown in the second display region 102. Each light detection unit 6 is disposed within a region where a pixel unit P is located, and may detect luminous brightness of a corresponding pixel unit P.

Figure 2:
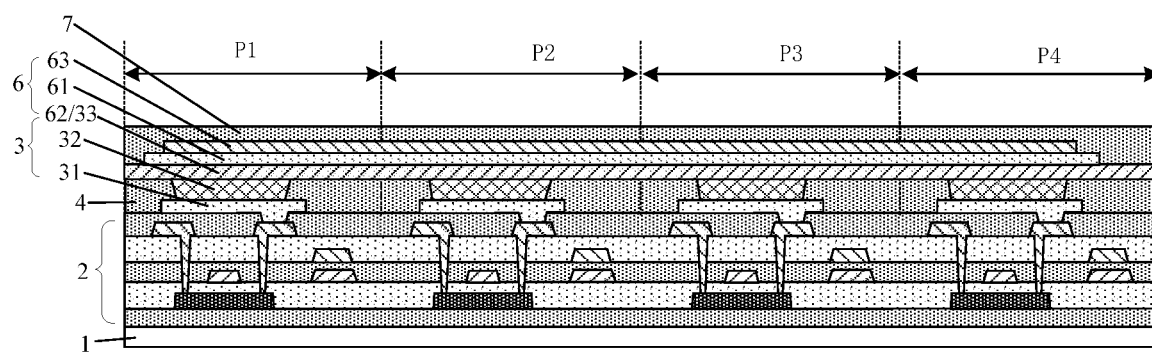
FIG. 2 is a schematic A-A sectional view of a structure of a display substrate in FIG. 1 according to some exemplary embodiments.

In some exemplary embodiments, as shown in FIG. 2, FIG. 2 shows a A-A sectional view of the display substrate shown in FIG. 1. The display substrate includes a drive structure layer 2 disposed on a substrate 1, a light-emitting element 3 disposed on the drive structure layer 2, and a light detection unit 6 disposed on the light-emitting element 3 and configured to detect brightness of the light-emitting element 3.

In some exemplary embodiments, the drive structure layer 102 includes a pixel drive circuit, and a pixel drive circuit of each sub-pixel may include multiple transistors and storage capacitors. For example, in FIG. 2, one drive transistor and one storage capacitor are illustrated as an example. The drive structure layer 2 includes a first insulating layer disposed on a flexible substrate 1, an active layer disposed on the first insulating layer, a second insulating layer covering the active layer, a first gate metal layer disposed on the second insulating layer, a third insulating layer covering the first gate metal layer, a second gate metal layer disposed on the third insulating layer, a fourth insulating layer covering the second gate metal layer, a source and drain metal layer disposed on the fourth insulating layer, and a flat layer covering the source and drain metal layer. The first gate metal layer includes at least a gate electrode and a first capacitor electrode, the second gate metal layer includes at least a second capacitor electrode, the source and drain metal layer includes at least a source electrode and a drain electrode, the active layer, the gate electrode, the source electrode and the drain electrode form the drive transistor, and the first capacitor electrode and the second capacitor electrode form the storage capacitor.

In some exemplary embodiments, the light-emitting element 3 may be disposed on the flat layer of the drive structure layer 2, and the light-emitting element 3 includes a first electrode 31, an organic light-emitting layer 23 and a second electrode 33 which are stacked. The first electrode 31 is connected with the drain electrode of the drive transistor through a first via opened on the flat layer. The display substrate also includes a pixel definition layer 4 which is provided with multiple pixel openings, and each pixel opening is used to define a light-emitting element 3.

In some exemplary embodiments, the light detection unit 6 is disposed on the second electrode 33 of the light-emitting element 3. In some examples, the third electrode 62 of the light detection unit 6 and the second electrode 33 of the light-emitting element 3 are an integrated structure, a photosensitive active layer 61 of the light detection unit 6 is directly disposed on the second electrode 33, and a fourth electrode 63 is disposed on the photosensitive active layer 61. In a region where a pixel unit P is located, each of the orthographic projections of the photosensitive active layer 61 and the fourth electrode 63 on the substrate 1 includes orthographic projections of effective light-emitting regions of all the sub-pixels in the pixel unit P on the substrate 1, and the photosensitive active layer 61 in the region where the pixel unit P is located is an integrated structure. The fourth electrodes 63 in regions where different pixel units P are located are separated from each other. A material of the photosensitive layer 61 can absorb light emitted by all sub-pixels in the pixel unit P and generate carriers. The light detection unit 6 can detect the brightness of each sub-pixel in the pixel unit P. In some examples, the display substrate is a top emission OLED display substrate, the first electrode 31 is a highly reflective anode, the second electrode 33 is a transparent or translucent cathode, and the fourth electrode 63 is a transparent or translucent anode.

In some exemplary embodiments, the display substrate further includes an encapsulation structure layer 7, which is disposed on the light detection unit 6. The encapsulation structure layer 7 may be a thin film encapsulation layer and may include a first inorganic encapsulation layer, an organic encapsulation layer and a second inorganic encapsulation layer stacked on the fourth electrode 63.

In some exemplary embodiments, the display substrate may be folded and unfolded, and may be applied to foldable display products, such as foldable mobile phones or foldable notebook computers. The first display region 101 may be a main screen region (in use state when the foldable display product is unfolded and folded), and the second display region 102 may be a secondary screen region (in use state only when the foldable display product is unfolded). The brightness of different positions in the first display region 101 may be detected by the nine light detection units 6 disposed in the first display region 101, and the brightness of different positions in the second display region 102 may be detected by the six light detection units 6 disposed in the second display region 102, so that brightness compensation may be performed for the first display region 101 or/and the second display region 102 according to the brightness difference between the first display region 101 and the second display region 102, thus improving the uniformity of brightness of the display substrate in the unfolded state. In some examples, the multiple light detection units 6 may directly detect the brightness of different positions of the display substrate in real time, thus achieving a process of real-time detection and compensation, and achieving the display effect of uniform brightness in different display regions.

The structure and preparation process of the display substrate will be further explained below with reference to a preparation method for a display substrate shown in FIG. 2. The "patterning process" mentioned herein includes processes such as film layer deposition, photoresist coating, mask exposing, developing, etching, and photoresist stripping. Processes such as sputtering, evaporation, chemical vapor deposition may be used for deposition, and are not limited herein. In the description of the present disclosure, "thin film" refers to a layer of thin film made of a certain material on a substrate 1 by deposition or other processes. In the description herein, "an orthographic projection of A includes an orthographic projection of B" means that the orthographic projection of B falls within a range of the orthographic projection of A, or the orthographic projection of A covers the orthographic projection of B.

(1) A drive structure layer 2 is formed.

Figure 3:
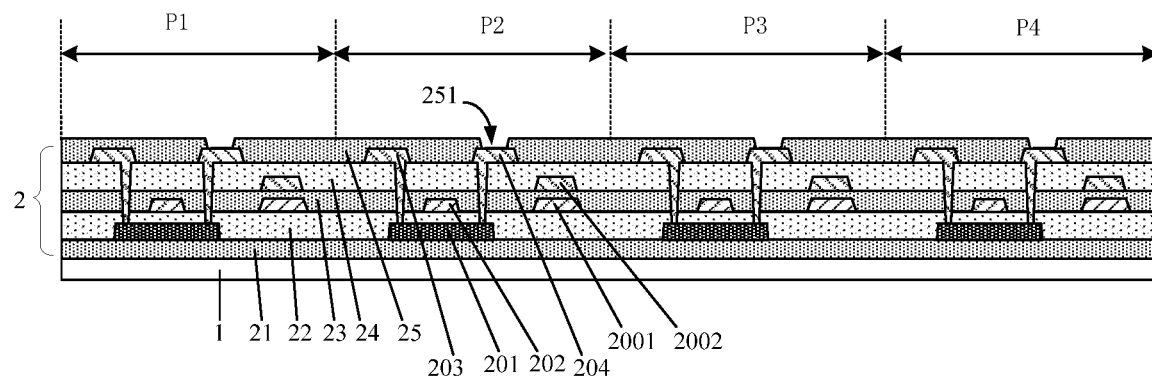
FIG. 3 is a schematic diagram of a structure after a drive structure layer is formed according to some exemplary embodiments.

In some exemplary embodiments, as shown in FIG. 3, a preparation process of the drive structure layer 2 may include the followings.

A first insulating thin film and an active layer thin film are sequentially deposited on a flexible substrate 1, and the active layer thin film is patterned by a patterning process, to form a first insulating layer 21 covering the entire flexible substrate 1 and a pattern of the active layer disposed on the first insulating layer 21, and the pattern of the active layer includes at least an active layer 201 of each sub-pixel.

Then, a second insulating thin film and a first metal thin film are sequentially deposited, and the first metal thin film is patterned by a patterning process, to form a second insulating layer 22 covering the pattern of the active layer and a pattern of a first gate metal layer disposed on the second insulating layer 22, and the pattern of the first gate metal layer includes at least a gate electrode 202 and a first capacitor electrode 2001 of each sub-pixel.

Then, a third insulating thin film and a second metal thin film are sequentially deposited, and the second metal thin film is patterned by a patterning process, to form a third insulating layer 23 covering the first gate metal layer and a pattern of a second gate metal layer disposed on the third insulating layer 23, the pattern of the second gate metal layer includes at least a second capacitor electrode 2002 of each sub-pixel, and a position of the second capacitor electrode 2002 corresponds to that of the first capacitor electrode 2001.

Then, a fourth insulating thin film is deposited and patterned by a patterning process to form a pattern of a fourth insulating layer 24 covering the second gate metal layer, the fourth insulating layer 24 of each sub-pixel is provided with at least two vias, the fourth insulating layer 24, the third insulating layer 23 and the second insulating layer 22 in the two via holes are etched away, to expose a surface of the active layer 201.

Then, a third metal thin film is deposited and patterned by a patterning process to form a pattern of a source and drain metal layer on the fourth insulating layer 24. The source and drain metal layer includes at least a source electrode 203 and a drain electrode 204 of each sub-pixel, and the source electrode 203 and the drain electrode 204 are respectively connected with the active layer 201 through two vias penetrating the fourth insulating layer 24, the third insulating layer 23 and the second insulating layer 22.

Then, a flat thin film of organic material is coated on the flexible substrate 1 formed with the above patterns, and a first via 251 is formed on a flat thin film of each sub-pixel through masking, exposing and developing processes, and the flat thin film in the first via 251 is developed to expose a surface of a drain electrode 204 of a transistor, thereby forming a flat layer (PLN) 25 covering the entire flexible substrate 1.

So far, preparation of the pattern of the drive structure layer 2 on the flexible substrate 1 is completed, as shown in FIG. 3. In the drive structure layer 2, the active layer 201, the gate electrode 202, the source electrode 203 and the drain electrode 204 form a drive transistor, and the first capacitor electrode 2001 and the second capacitor electrode 2002 form a storage capacitor.

In some exemplary embodiments, the first insulating layer, the second insulating layer, the third insulating layer and the fourth insulating layer may adopt any one or more of silicon oxide (SiOx), silicon nitride (SiNx) and silicon oxynitride (SiON), and may be a single layer, multiple layers or a composite layer. The first insulating layer is referred to as a buffer layer, which is used to improve water oxygen resistance of the substrate 1. The second insulating layer and the third insulating layer are referred to as gate insulating (GI) layers. The fourth insulating layer is referred to as an interlayer insulating (ILD) layer. The first metal thin film, the second metal thin film and the third metal thin film may adopt metals such as any one or more of silver (Ag), copper (Cu), aluminum (Al), titanium (Ti) and molybdenum (Mo), or alloy thereof, such as aluminum neodymium alloy (AlNd) or molybdenum niobium alloy (MoNb) and may be a single-layer structure or a multi-layer composite structure, for example, Ti/Al/Ti, etc. The active layer thin film may adopt various materials such as amorphous indium gallium zinc oxide (a-IGZO), zinc oxynitride (ZnON), indium zinc tin oxide (IZTO), amorphous silicon (a-Si), polycrystalline silicon (p-Si), hexathiophene, or polythiophene, etc., that is, the present disclosure is applicable to transistors manufactured based on oxide technology, silicon technology and organic matter technology.

(2) A first electrode 31 of a light-emitting element 3 is formed.

Figure 4:
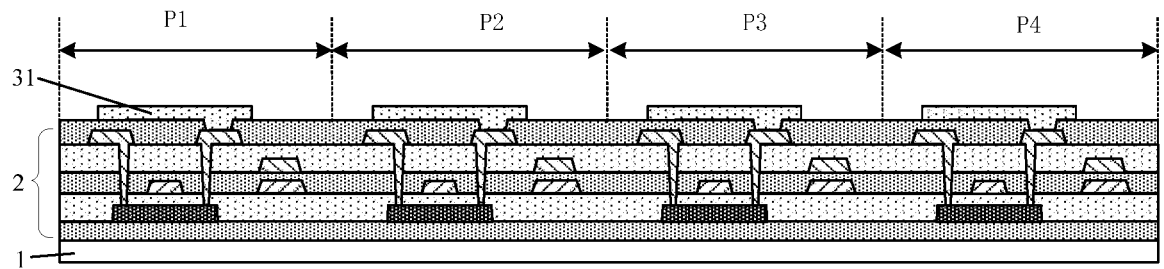
FIG. 4 is a schematic diagram of a structure after a first electrode is formed according some exemplary embodiments.

In some exemplary embodiments, as shown in FIG. 4, a transparent conductive thin film is deposited on the flexible substrate 1 formed with the above patterns, and the transparent conductive thin film is patterned through a patterning process to form a pattern of the first electrode 31 of the light-emitting element 3. The first electrode 31 is formed on the flat layer 25 and is connected with the drain electrode 204 of the drive transistor through the first via 251 of the flat layer 25. A material of the first electrode 31 may be a highly reflective material.

(3) A pixel definition layer 4 is formed.

Figure 5:
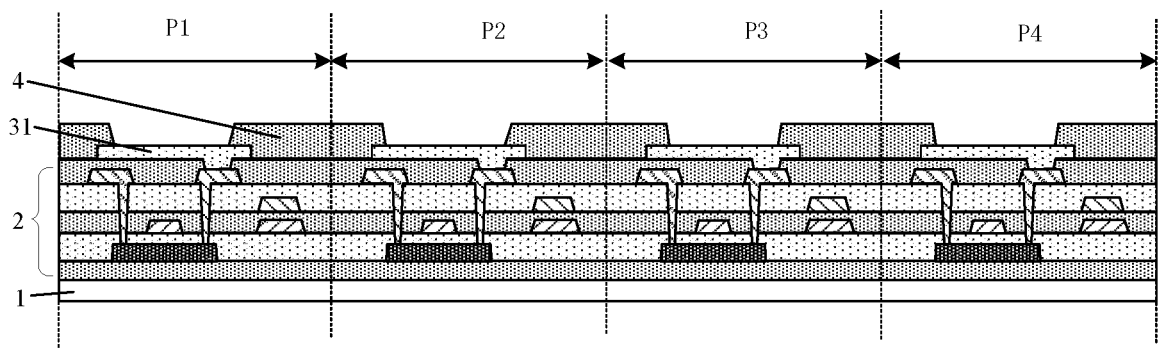
FIG. 5 is a schematic diagram of a structure after a pixel definition layer is formed according to some exemplary embodiments.

In some exemplary embodiments, as shown in FIG. 5, a pixel definition thin film is coated on the substrate 1 formed with the above patterns, and the pixel definition layer (PDL) 4 is formed through masking, exposing and developing processes. The pixel definition layer 4 is provided with multiple pixel openings, and the pixel definition layer 4 in the pixel openings is developed to expose a surface of the first electrode 31. A material of the pixel definition layer may adopt polyimide, acrylic, polyethylene terephthalate, or the like.

(4) An organic functional layer 32 and a second electrode 33 are sequentially formed on the flexible substrate 1 formed with the above patterns.

Figure 6:
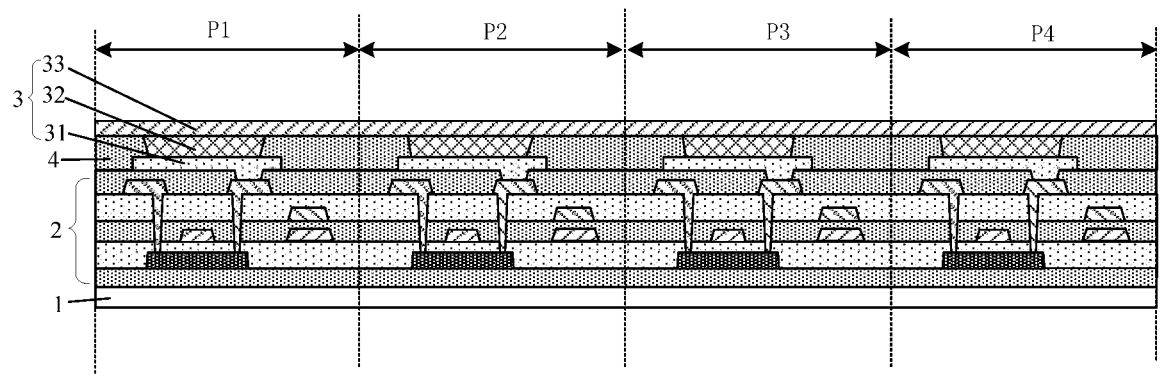
FIG. 6 is a schematic diagram of a structure after a second electrode is formed according to some exemplary embodiments.

In some exemplary embodiments, as shown in FIG. 6, the organic functional layer 32 is formed in the pixel openings of the pixel definition layer 4, so that the organic functional layer 32 is connected with the first electrode 31, and the second electrode 33 is formed on the pixel definition layer 4 and connected with the organic functional layer 32. The effective light-emitting region of each sub-pixel is a region of the pixel definition layer 4 that defines the pixel opening of the sub-pixel in a direction parallel to the substrate 1. The second electrodes 33 of multiple sub-pixels are an integrated structure and connected with each other.

In some exemplary embodiments, the organic functional layer 32 may include a hole injection layer, a hole transport layer, a light-emitting layer, an electron transport layer, and an electron injection layer which are stacked. A material of the second electrode 33 may adopt any one or more of magnesium (Mg), silver (Ag), aluminum (Al), copper (Cu) and lithium (Li), or an alloy made of any one or more of the above metals. The second electrode 33 may be a transparent or semi-transparent electrode layer.

In some exemplary embodiments, the second electrode 33 of the light-emitting element 3 and the third electrode 62 of the light detection unit 6 may be a shared structure, and the second electrode 33 of the light-emitting element 3 and the third electrode 62 of the light detection unit 6 may both be cathodes.

(5) A photosensitive active layer 61 is formed on the flexible substrate 1 formed with the above patterns.

Figure 7:
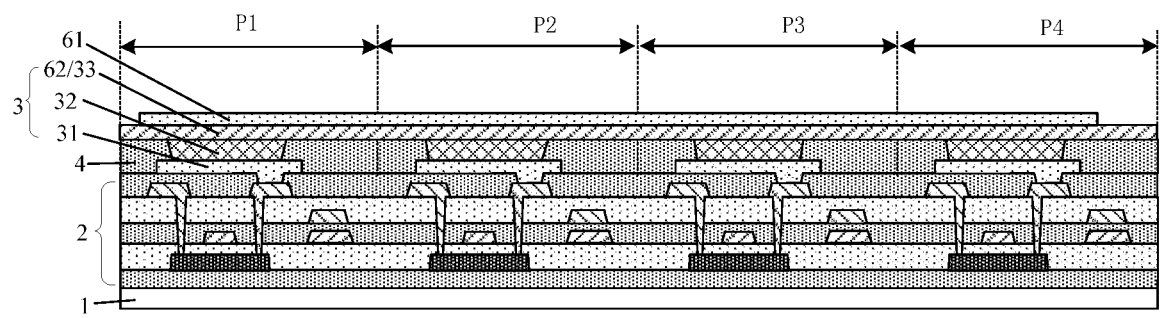
FIG. 7 is a schematic diagram of a structure after a photosensitive active layer is formed according to some exemplary embodiments.

In some exemplary embodiments, as shown in FIG. 7, the photosensitive active layer 61 may be formed on the second electrode 33 by evaporation process, and the photosensitive active layer 61 covers effective light-emitting regions of all the sub-pixels of a pixel unit P, that is, an orthographic projection of the photosensitive active layer 61 on the substrate 1 includes orthographic projections of the effective light-emitting regions of all the sub-pixels of the pixel unit P on the substrate 1.

In some exemplary embodiments, the orthographic projection of the photosensitive active layer 61 on the substrate 1 does not overlap with orthographic projections of effective light-emitting regions of the sub-pixels of other pixel units P on the substrate 1.

In some exemplary embodiments, an orthographic projection range of the photosensitive active layer 61 on the substrate 1 may be set according to the number of pixel units P to be detected.

In some exemplary embodiments, a material of the photosensitive active layer 61 can absorb the light emitted by all the sub-pixels in the pixel unit P and generate carriers, and the light detection unit 6 can detect the brightness condition of the four sub-pixels of the pixel unit P. The material of the photosensitive active layer 61 may have strong light absorption intensity at an entire visible light band of 380 to 780 nm. For example, the material of the photosensitive active layer 61 may be a mixed material system of a red light absorption material, a green light absorption material and a blue light absorption material, or a single material system with strong light absorption intensity at the entire visible light band of 380 to 780 nm.

(6) A fourth electrode 63 of the light detection unit 6 is formed on the flexible substrate 1 formed with the above patterns.

Figure 8:
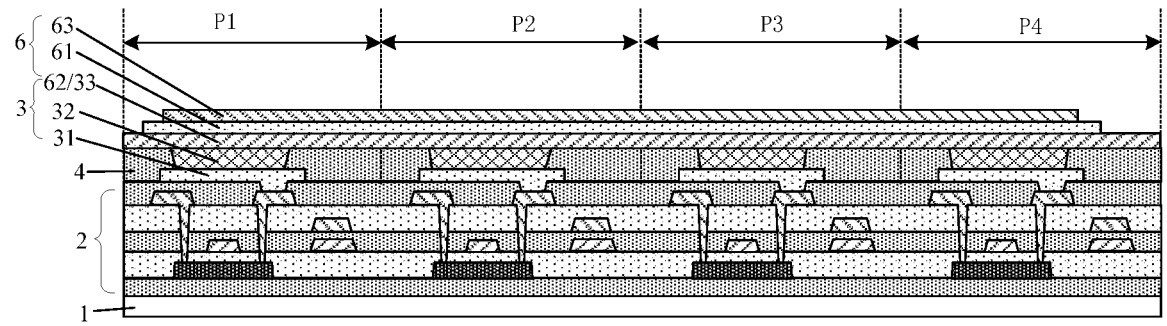
FIG. 8 is a schematic diagram of a structure after a fourth electrode is formed according to some exemplary embodiments.

In some exemplary embodiments, as shown in FIG. 8, the fourth electrode 63 is formed on the photosensitive active layer 61. In a pixel unit P, the fourth electrodes 63 of the four sub-pixels may be an integrated structure, or each sub-pixel may be provided with a fourth electrode 63 separately. A material of the fourth electrode (anode) 63 may include any one or more of silver (Ag), aluminum (Al) and gold (Au). The fourth electrode 63 may be a transparent or semitransparent electrode layer.

In some exemplary embodiments, the light detection unit 6 may detect luminous brightness of all sub-pixels in a pixel unit P. For example, when a picture displayed by the display substrate is set to be a monochrome picture (that is, a picture displayed when only red sub-pixels or green sub-pixels or blue sub-pixels emit light), the light detection unit 6 detects luminous brightness of sub-pixels of the same color; when the picture displayed by the display substrate is set to be a mixed color picture (that is, a picture displayed when sub-pixels of different colors emit light), the light detection unit 6 detects luminous brightness of sub-pixels of different colors.

(7) An encapsulation structure layer 7 is formed on the flexible substrate 1 formed with the above patterns.

In some exemplary embodiments, as shown in FIG. 2, the encapsulation structure layer 7 covers the light detection unit 6 and the second electrode 33.

Figure 9:
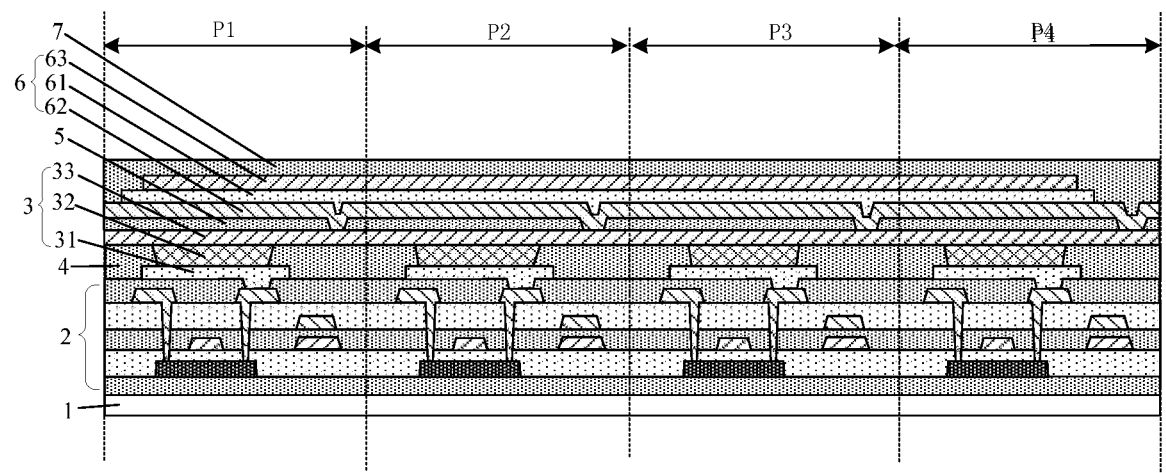
FIG. 9 is a schematic A-A sectional view of a structure of a display substrate in FIG. 1 according to some exemplary embodiments.

In some exemplary embodiments, as shown in FIG. 9, the second electrode 33 of the light-emitting element 3 and the third electrode 62 of the light detection unit 6 are not shared, a capping layer 5 is disposed between them, and the third electrode 62 is connected with the second electrode 33 through a via opened on the capping layer 5. In a region where a pixel unit P is located, each of the orthographic projections of the photosensitive active layer 61, the third electrode 62 and the fourth electrode 63 on the substrate 1 includes the orthographic projections of the effective light-emitting regions of all the sub-pixels in the pixel unit P on the substrate 1, and the photosensitive active layer 61 in the region where the pixel unit P is located may be an integrated structure. Any one of the third electrode 62 and the fourth electrode 63 on the display substrate may be an integrated structure, and the other is separated from each other in regions where different pixel units P are located. For example, for the convenience of wirings, the third electrode 62 may be an integrated structure, and the orthographic projection of the third electrode 62 on the substrate 1 may include an orthographic projection of the capping layer 5 on the substrate 1. The fourth electrodes 63 in the regions where different pixel units P are located are separated from each other. The capping layer 5 may be not provided with a via for connecting the third electrode 62 with the second electrode 32. The third electrode 62 is connected with a low voltage line in a peripheral region of the display substrate (the low voltage line is connected with the second electrode of the light-emitting element). The display substrate may be a top emission OLED display substrate, a material of the first electrode 31 may be a highly reflective material, and the materials of the second electrode 33, the third electrode 62 and the fourth electrode 63 may all be transparent or semitransparent materials.

Figure 10:
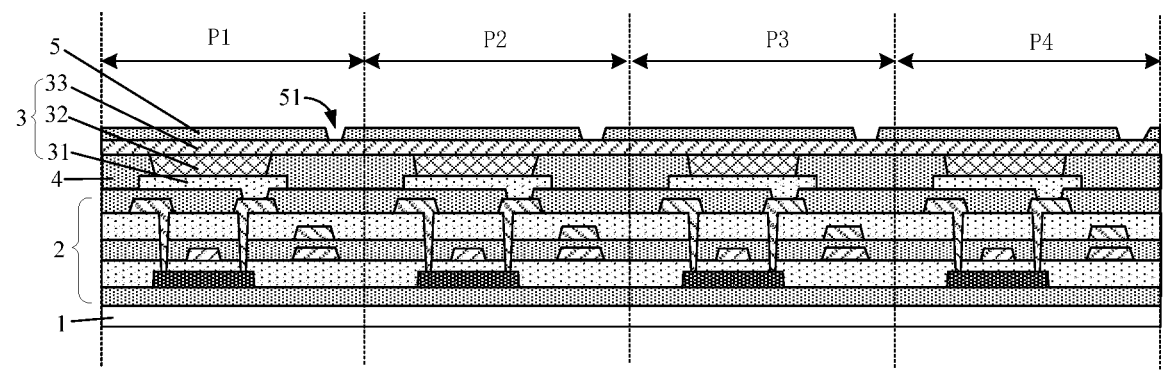
FIG. 10 is a schematic diagram of a structure after a capping layer is formed on a second electrode according to some exemplary embodiments.
Figure 11:
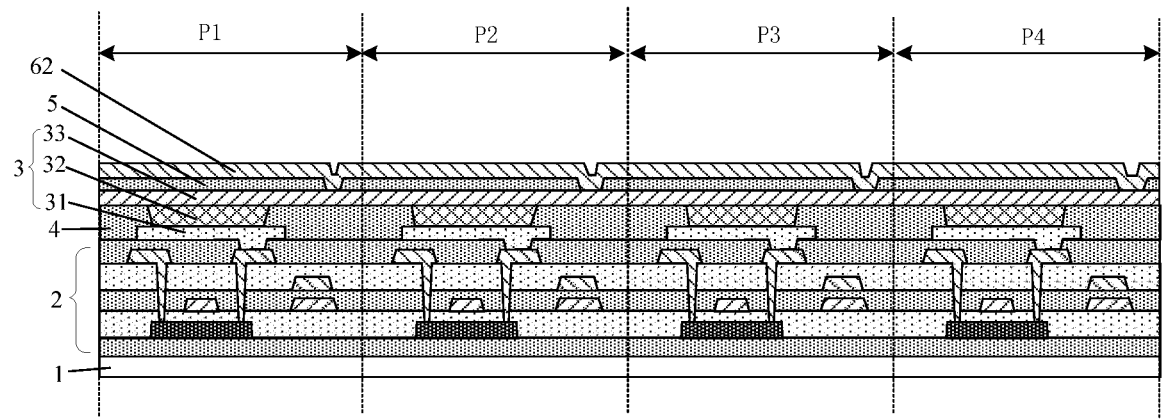
FIG. 11 is a schematic diagram of a structure after a third electrode is formed on a capping layer according to some exemplary embodiments.
Figure 12:
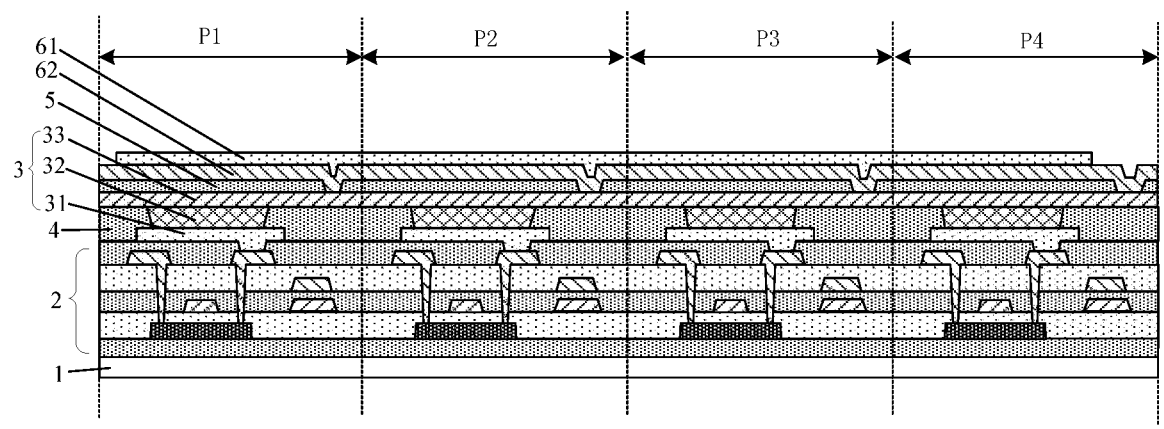
FIG. 12 is a schematic diagram of a structure after a photosensitive active layer is formed according to some exemplary embodiments.
Figure 13:
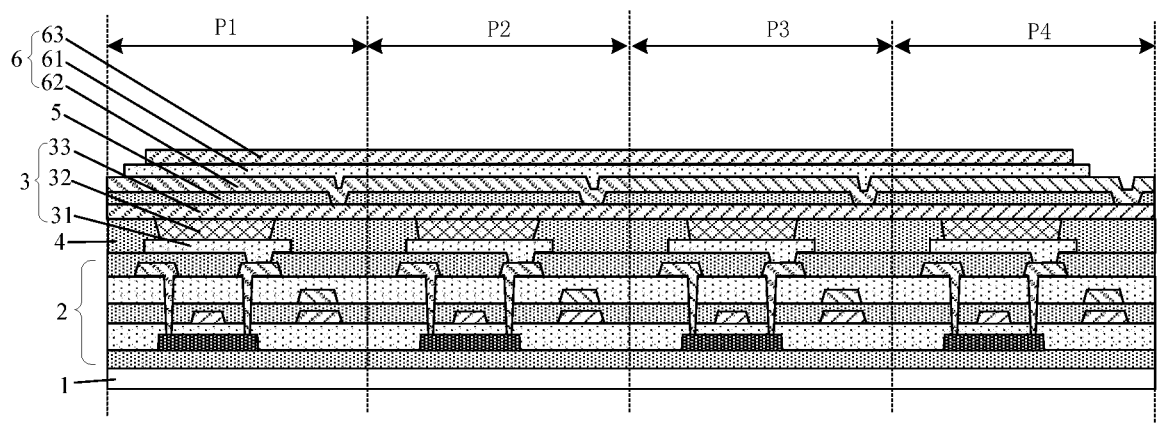
FIG. 13 is a schematic diagram of a structure after a fourth electrode is formed according to some exemplary embodiments.

In some exemplary embodiments, during the preparation process of the display substrate, as shown in FIG. 10, after the second electrode 33 of the light-emitting element 3 is formed, a capping layer thin film is coated on the second electrode 33, and the capping layer 5 is formed through masking, exposing and developing processes. Multiple second vias 51 are opened on the capping layer 5, and the capping layer 5 in the second vias 51 is developed to expose a surface of the second electrode 33. The capping layer 5 may be a light extraction layer. Then, as shown in FIG. 11, a third electrode thin film is deposited on the capping layer 5, and the third electrode thin film is connected with the second electrode 33 through the second vias 51 on the capping layer 5. A material of the third electrode (cathode) 62 may be Mg—Ag alloy (Mg:Ag). Then, as shown in FIG. 12, a photosensitive active layer 61 is formed on the third electrode 62, and a formation process of the photosensitive active layer 61 may be the same as the preparation process of the photosensitive active layer 61 in FIG. 7 described above. Then, as shown in FIG. 13, a fourth electrode 63 is formed on the photosensitive active layer 61, and a formation process of the fourth electrode 63 may be the same as the preparation process of the fourth electrode 63 in FIG. 8 described above.

In some exemplary embodiments, as described in the exemplary embodiments of FIG. 1 to FIG. 13, the light detection unit 6 is disposed in a region where a pixel unit P is located, and the orthographic projection of the photosensitive active layer 61 of the light detection unit 6 on the substrate 1 includes the orthographic projections of the effective light-emitting regions of all the sub-pixels of the pixel unit P on the substrate 1, and does not overlap with the orthographic projections of the effective light-emitting regions of the sub-pixels of other pixel units P on the substrate 1. In other examples, the orthographic projection of the photosensitive active layer 61 of the light detection unit 6 on the substrate 1 may also overlap with the orthographic projections of the effective light-emitting regions of the sub-pixels of other pixel units P on the substrate 1. For example, the display substrate includes multiple light detection units 6. All the sub-pixels of which orthographic projections of the effective light-emitting regions on the substrate 1 overlap with an orthographic projection of a photosensitive active layer 61 of a corresponding light detection unit 6 on the substrate 1 are referred to as a group of sub-pixels. A light detection unit 6 corresponds to a group of sub-pixels, and any two groups of sub-pixels have the same types and number of sub-pixels. In this way, when the picture displayed by the display substrate is set to be a monochrome picture (for example, a picture displayed when red sub-pixels emit light), It can be ensured that the brightness data detected by any one light detection unit 6 is based on luminous brightness data of the same number of sub-pixels of the same color. Exemplarily, a group of sub-pixels corresponding to each light detection unit 6 includes all sub-pixels of a corresponding pixel unit P, and may also include sub-pixels of other pixel units P (for example, a red sub-pixel of other pixel units P).

In some exemplary embodiments, within a region where each sub-pixel of some pixel units is located, the light detection unit is disposed, and photosensitive active layers in the regions where sub-pixels of different colors of the pixel unit are located are separated from each other and made of different materials.

Figure 14:
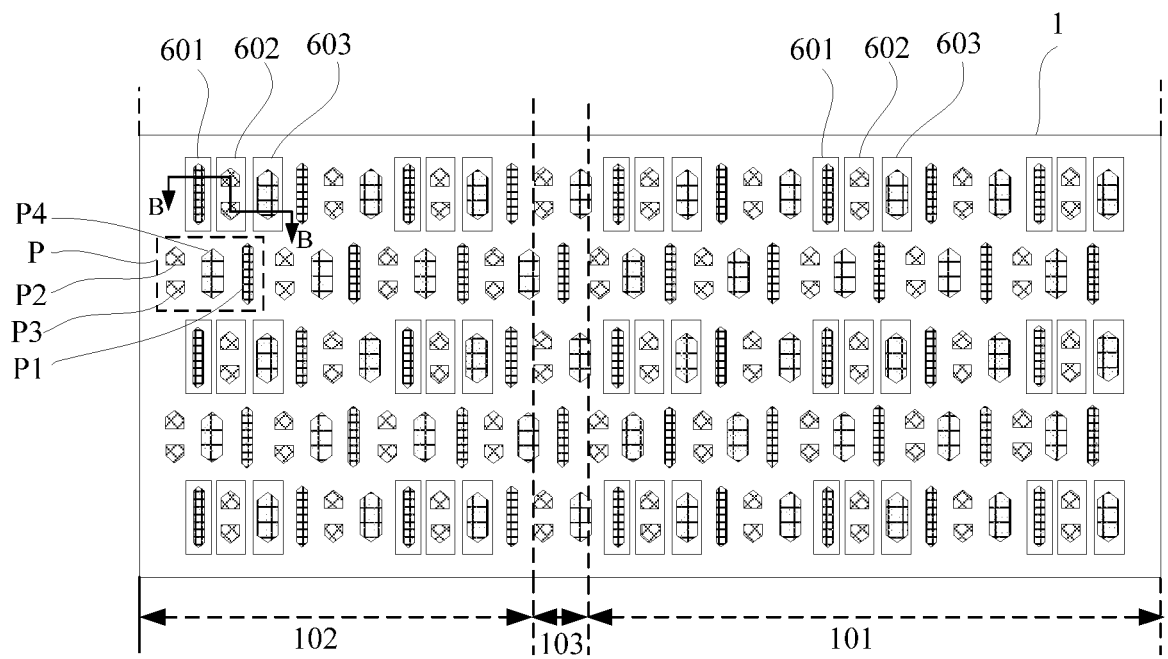
FIG. 14 is a schematic plan view of a structure of a display substrate according to some exemplary embodiments.

In some exemplary embodiments, as shown in FIG. 14, FIG. 14 shows a plan view of a structure of a display substrate. In an example, within both a first display region 101 and a second display region 102, multiple light detection units 6 are disposed, each light detection unit 6 is disposed in a region where a sub-pixel of a same color of a pixel unit P is located, and each of the orthographic projections of the photosensitive active layer, the third electrode and the fourth electrode of each light detection unit 6 on the substrate 1 includes the orthographic projection of the effective light-emitting region of the corresponding sub-pixel on the substrate 1. Each light detection unit 6 is configured to detect the brightness of the sub-pixel of the same color in a pixel unit P, and the material of the photosensitive active layer 61 can absorb the light emitted by the sub-pixel of the corresponding color and generate carriers. In an example, each pixel unit P may include four sub-pixels, which are a first sub-pixel P1 emitting red light, a second and third sub-pixels P2 and P3 emitting green light, and a fourth sub-pixel P4 emitting blue light, respectively. Within a region where a pixel unit P is located, three light detection units are disposed, including: a first light detection unit 601 which is disposed in a region where the first sub-pixel P1 is located and detects the luminous brightness of the first sub-pixel P1, a second light detection unit 602 which is disposed in a region where the second sub-pixel P2 and the third sub-pixel P3 are located and detects the luminous brightness of the second sub-pixel P2 and the third sub-pixel P3, and a third light detection unit 603 which is disposed in a region where the fourth sub-pixel P4 is located and detects the luminous brightness of the fourth sub-pixel P4. The photosensitive active layers of the first light detection unit 601, the second light detection unit 602 and the third light detection unit 603 are separated from each other and made of different materials.

In some exemplary embodiments, the multiple light detection units disposed in a region where a pixel unit P is located are referred to as a group of light detection units (for example, the first light detection unit 601, the second light detection unit 602 and the third light detection unit 603 are referred to as a group of light detection units), and multiple positions on the display substrate may each be provided with a group of light detection units. In an example, within the first display region 101, nine groups of light detection units are disposed, including nine first light detection units 601 for detecting the luminous brightness of green sub-pixels, nine second light detection units 602 for detecting the luminous brightness of blue sub-pixels and nine third light detection units 603 for detecting the luminous brightness of red sub-pixels. Within the second display region 102, six groups of light detection units are disposed, including six first light detection units 601 for detecting the luminous brightness of green sub-pixels, six second light detection units 602 for detecting the luminous brightness of blue sub-pixels and six third light detection units 603 for detecting the luminous brightness of red sub-pixels. In other examples, the number of groups of light detection units in the first display region 101 and the second display region 102 may be set according to a size of a corresponding display region. For example, within the first display region 101, nine to twelve groups of light detection units may be disposed, and within the second display region 102, three to six groups of light detection units may be disposed.

Figure 15:
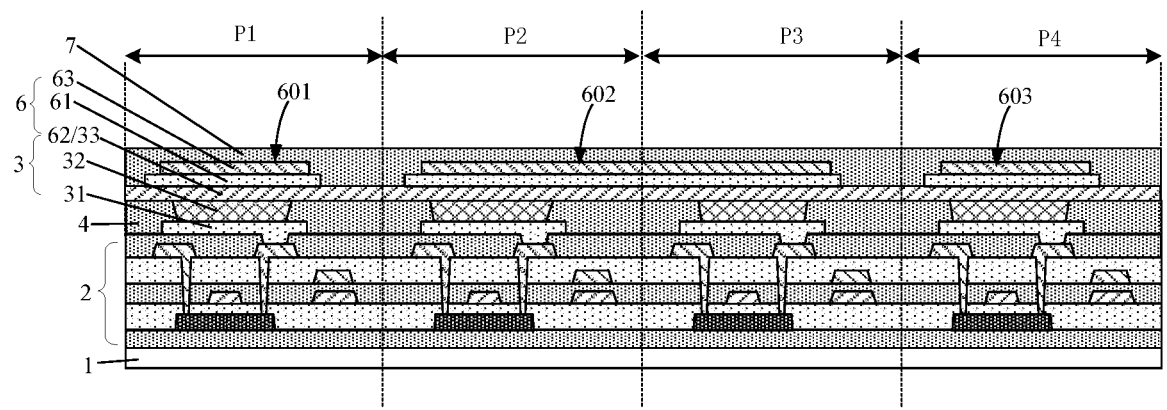
FIG. 15 is a schematic B-B sectional view of a structure of a display substrate in FIG. 14 according to some exemplary embodiments.

In some exemplary embodiments, as shown in FIG. 15, FIG. 15 shows a B-B sectional view of the display substrate shown in FIG. 14. The display substrate includes a drive structure layer 2 disposed on the substrate 1, a light-emitting element 3 disposed on the drive structure layer 2, a light detection unit 6 disposed on the light-emitting element 3, and an encapsulation structure layer 7 disposed on the light detection unit 6. In an example, a third electrode 62 of each light detection unit 6 and a second electrode 33 of the light-emitting element 3 may be an integrated structure, a photosensitive active layer 61 of each light detection unit 6 is directly disposed on the second electrode 33, and a fourth electrode 63 is disposed on the photosensitive active layer 61. Photosensitive active layers 61 and fourth electrodes 63 in regions where sub-pixels of different colors of a pixel unit P are located are separated from each other.

Figure 16:
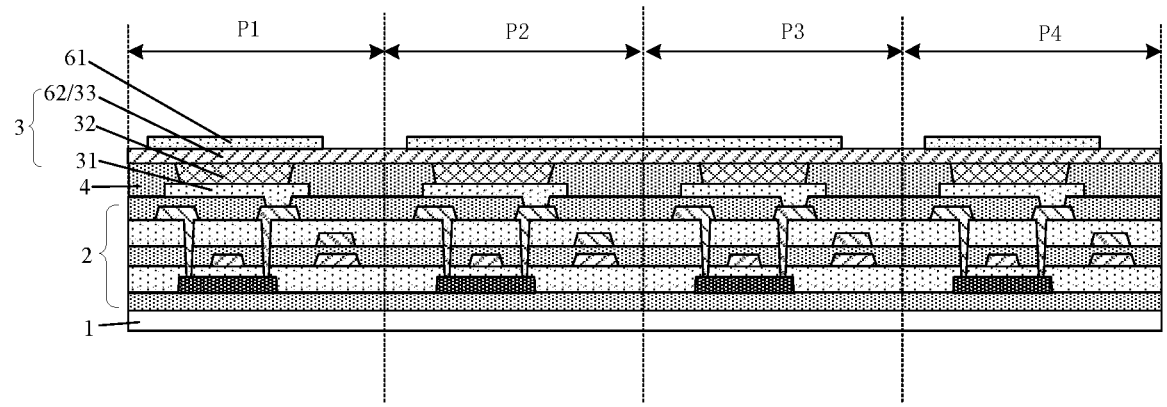
FIG. 16 is a schematic diagram of a structure after a photosensitive active layer is formed on a second electrode according to some exemplary embodiments.

In some exemplary embodiments, in a preparation process of the display substrate shown in FIG. 15, as shown in FIG. 16, after the second electrode 33 of the light-emitting element 3 is formed, three photosensitive active layers 61 are formed on the second electrodes 33 in a region where the first sub-pixel P1 is located, a region where the second sub-pixel P2 and the third sub-pixel P3 are located, and a region where the fourth sub-pixel P4 is located, respectively. An orthographic projection of each photosensitive active layer 61 on the substrate 1 includes an orthographic projection of an effective light-emitting region of a sub-pixel where it is located on the substrate 1, and the three photosensitive active layers 61 are not overlapped and separated from each other. The three photosensitive active layers 61 are made of different materials and may be formed by three evaporation processes. Materials of the three photosensitive active layers 61 may absorb the light emitted by sub-pixels of corresponding colors and generate carriers. The first light detection unit 601 detects a red sub-pixel, and a material of the photosensitive active layer 61 of the first light detection unit 601 may have strong absorption at a red light band of 630 nm, for example, may be a copper phthalocyanine derivative material, or the like. The second light detection unit 602 detects a green sub-pixel, and a material of the photosensitive active layer 61 of the second light detection unit 602 may have strong absorption at a green light band of 530 nm, for example, may be a perylene diimide derivative material. The third light detection unit 603 detects a blue sub-pixel, and a material of the photosensitive active layer 61 of the third light detection unit 603 may have strong absorption at a blue light band of 460 nm, for example, may be a derivative material based on boron dipyrrole (Bodipy) structure. Molecular structural formulas of the derivative material based on Bodipy structure, the copper phthalocyanine derivative material and the perylene diimide derivative material may be respectively:

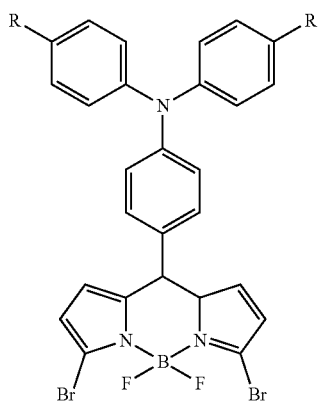

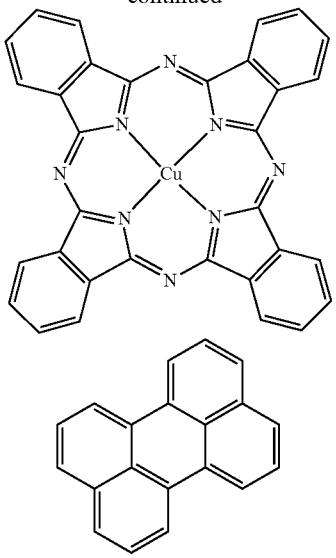

In some exemplary embodiments, a pixel unit P may include four sub-pixels that emit red light, green light, blue light and white light, respectively. Correspondingly, the display substrate may include a light detection unit that is configured to detect the luminous brightness of the white sub-pixel (an organic functional layer 32 of the white sub-pixel may include a red light-emitting layer, a green light-emitting layer and a blue light-emitting layer that are stacked).

A material of the photosensitive active layer of the light detection unit for detecting the luminous brightness of the white sub-pixel may be a mixed material system of a red light absorption material, a green light absorption material and a blue light absorption material, or a single material system with a strong light absorption intensity at the entire visible light band of 380 to 780 nm.

Figure 17:
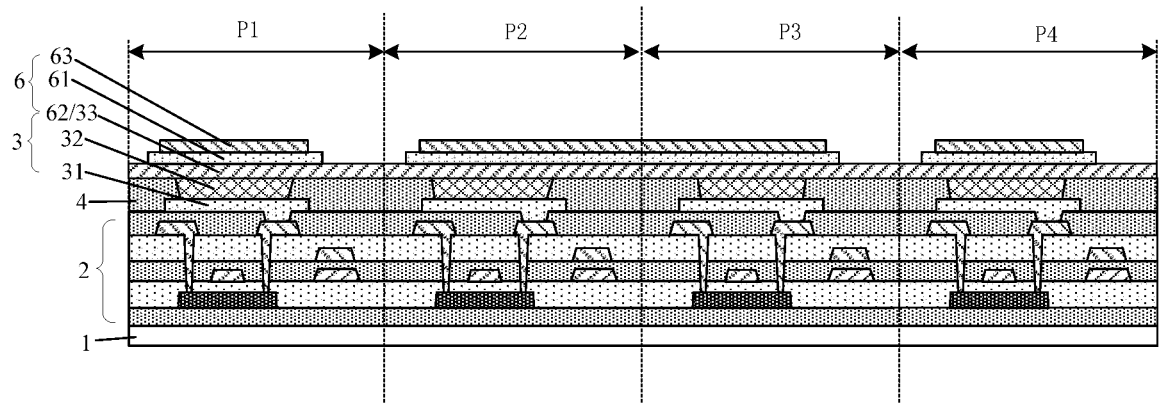
FIG. 17 is a schematic diagram of a structure after a fourth electrode is formed according to some exemplary embodiments.

In some exemplary embodiments, as shown in FIG. 17, three fourth electrodes 63 may be respectively formed on the three photosensitive active layers 61 by an evaporation process, that is, one fourth electrode 63 is formed on each photosensitive active layer 61. Three formed fourth electrodes 63 are formed on the three photosensitive active layers 61 by utilizing a size of an opening region of a mask plate used in the evaporation process. The three fourth electrodes 63 are independent electrodes separated from each other. In an example, as shown in FIG. 15, an encapsulation structure layer 7 is formed, and the encapsulation structure layer 7 covers the above structure.

Figure 18:
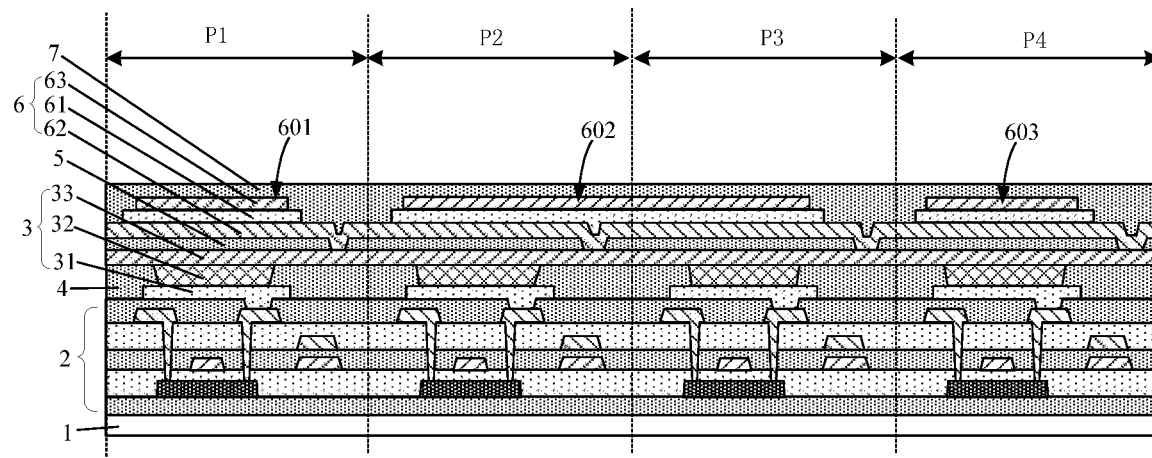
FIG. 18 is a schematic B-B sectional view of a structure of a display substrate in FIG. 14 according to some exemplary embodiments.
Figure 19:
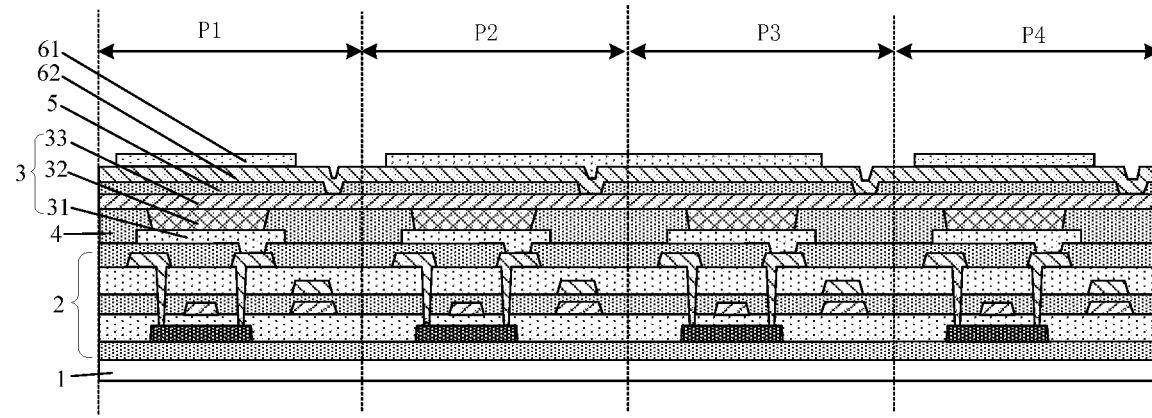
FIG. 19 is a schematic diagram of a structure after a photosensitive active layer is formed according to some exemplary embodiments.
Figure 20:
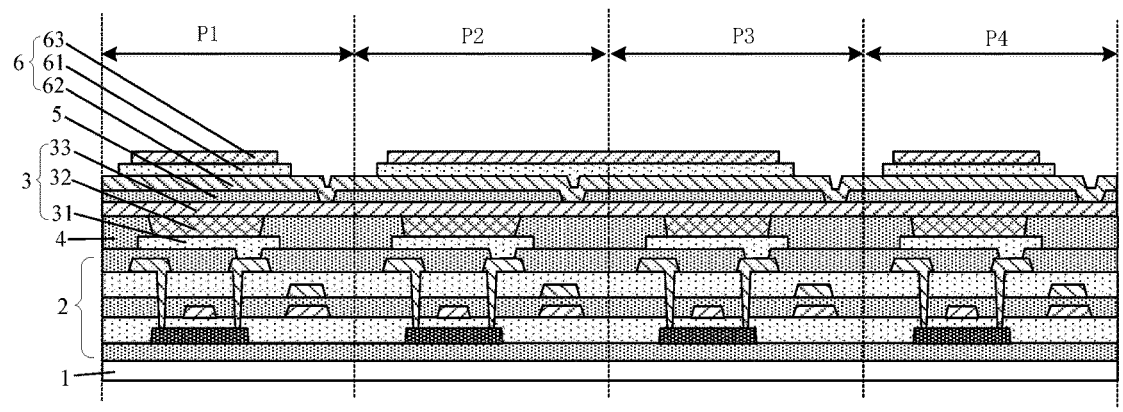
FIG. 20 is a schematic diagram of a structure of after a fourth electrode is formed according to some exemplary embodiments.

In some exemplary embodiments, FIG. 18 shows a B-B sectional view of the display substrate shown in FIG. 14. In an example, a second electrode 33 of a light-emitting element 3 and a third electrode 62 of a light detection unit 6 are not shared, a capping layer 5 is disposed between them, and the third electrode 62 is connected with the second electrode 33 through a via opened on the capping layer 5. Any one of the third electrode 62 and a fourth electrode 63 on the display substrate may be an integrated structure, and the other is separated from each other in regions where sub-pixels of different colors are located. For example, for the convenience of wirings, the third electrode 62 may be an integrated structure, an orthographic projection of the third electrode 62 on the substrate 1 may include an orthographic projection of the capping layer 5 on the substrate 1, and the fourth electrodes 63 in regions where sub-pixels of different colors of a pixel unit P are located are separated from each other. The capping layer 5 may be not provided with a via for connecting the third electrode 62 with the second electrode 33, and the third electrode 62 is connected with a low voltage line in a peripheral region of the display substrate (the low voltage line is connected with the second electrode of the light-emitting element). In the preparation process of the display substrate of the present example, the method for forming the capping layer 5 on the second electrode 33 of the light-emitting element 3 may be the same as that of FIG. 10 described above, and the method for forming the third electrode 62 on the capping layer 5 may be the same as that of FIG. 11 described above. As shown in FIG. 19, after the third electrode 62 is formed, three photosensitive active layers 61 are formed on the third electrodes 62 in a region where a first sub-pixel P1 is located, a region where a second sub-pixel P2 and a third sub-pixel P3 are located, and a region where a fourth sub-pixel P4 is located, respectively. The method for forming the three photosensitive active layers 61 may be the same as that of FIG. 16 described above. As shown in FIG. 20, three fourth electrodes 63 are respectively formed on the three photosensitive active layers 61, and the method for forming the three fourth electrodes 63 may be the same as that of FIG. 17 described above.

Figure 21:
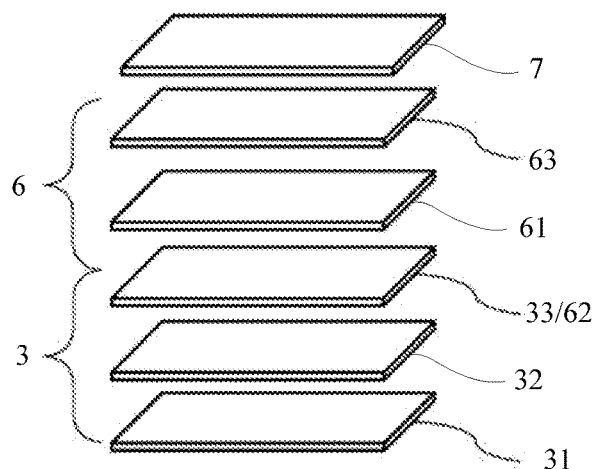
FIG. 21 is a schematic diagram of a film layer structure of a display substrate according to some exemplary embodiments.

In some exemplary embodiments, as shown in FIG. 21, FIG. 21 shows a schematic diagram of a film layer structure of a display substrate when a second electrode 33 of a light-emitting element 3 and a third electrode 62 of a light detection unit 6 are an integrated shared structure. In an example, a photosensitive active layer 61 of the light detection unit 6 is directly disposed on the second electrode 33 of the light-emitting element 3.

Figure 22:
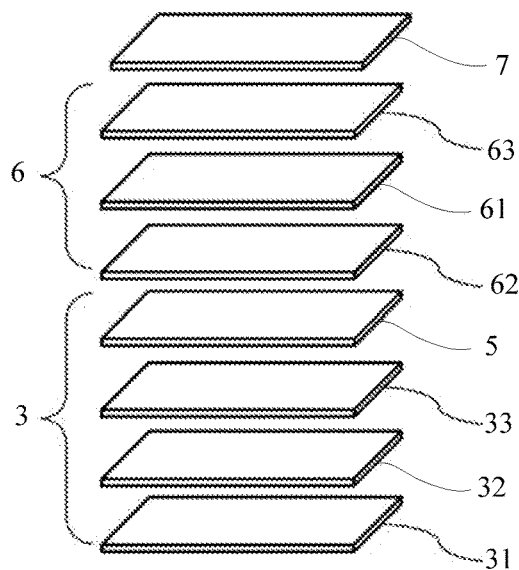
FIG. 22 is a schematic diagram of a film layer structure of a display substrate according to some exemplary embodiments.

In some exemplary embodiments, as shown in FIG. 22, FIG. 22 shows a schematic diagram of a film layer structure of a display substrate when a capping layer 5 is disposed between a second electrode 33 of a light-emitting element 3 and a third electrode 62 of a light detection unit 6. In an example, the capping layer 5 is disposed on the second electrode 33 of the light-emitting element 3, and the third electrode 62 of the light detection unit 6 is disposed on the capping layer 5 and connected with the second electrode 33 of the light-emitting element 3 through a second via 51 opened on the capping layer 5.

Figure 23:
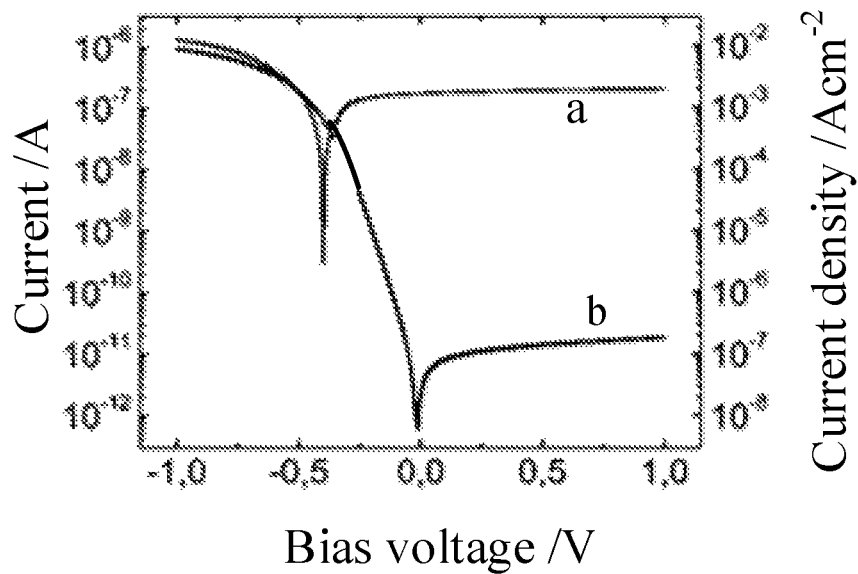
FIG. 23 is a diagram of relations between a current and an applied bias voltage of a light detection unit of a display substrate when being not illuminated and when being illuminated according to some exemplary embodiments.

In some exemplary embodiments, FIG. 23 shows a diagram of relations between a current and an applied bias voltage of a light detection unit 6 of a display substrate when being not illuminated and when being illuminated according to some exemplary embodiments. As shown in FIG. 23, a working principle of a light detection unit 6 detecting luminous brightness of a light-emitting element 3 may be: in a reverse bias positive voltage interval of the light detection unit 6 (a forward bias voltage or a negative bias voltage may be applied between a third electrode 62 and a fourth electrode 63 of the light detection unit 6, and in an example, the light detection unit 6 may always work in the reverse bias positive voltage interval shown in FIG. 23), as shown by the curve b in FIG. 23, when the light-emitting element 3 is not lit, the light detection unit 6 is not illuminated, and a current density of the light detection unit 6 is very small (a current at this time is a dark current). As shown by the curve a, when the light-emitting element 3 is lit and work, a photosensitive active layer 61 of the light detection unit 6 is excited after being irradiated by the light emitted by the light-emitting element 3, and photo-induced carriers are formed in the photosensitive active layer 61, so that a photocurrent which is many times higher than the dark current is formed in the light detection unit 6, and the luminous brightness of the light-emitting element 3 can be sensed and detected. The brightness of the light-emitting element 3 directly affects the photocurrent of the light detection unit 6, so the light detection unit 6 may directly detect the luminous brightness condition of the light-emitting element 3. A change trend of the brightness of the light-emitting element 3 may be monitored through a change trend of the photocurrent of the light detection unit 6. The working principle of the light detection unit 6 is similar to that of a photodiode.

Figure 24:
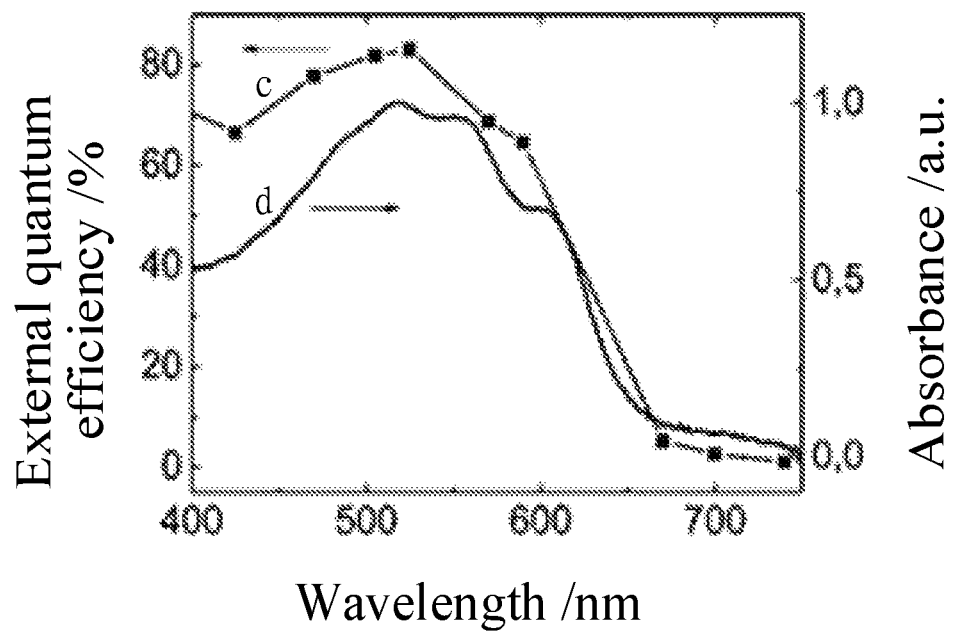
FIG. 24 is an absorption spectrum diagram and a photoelectric conversion efficiency diagram of a response band of a light detection unit of a display substrate according to some exemplary embodiments.

In some exemplary embodiments, FIG. 24 shows an absorption spectrum diagram and a photoelectric conversion efficiency diagram of a response band of a light detection unit 6 of a display substrate according to some exemplary embodiments. In an example, as shown in FIG. 24, the curve d represents a absorption spectrum of a photosensitive active layer 61 at the visible light band of 380 to 780 nm, for example, it has strong absorption at the entire visible light range, or it has strong absorption at a red, green or blue light band alone; the curve c represents an efficiency level of the light detection unit 6 in converting the illumination of a light-emitting element 3 into a photocurrent. The larger an external quantum efficiency value is, the higher the photoelectric conversion efficiency is. A band response curve of the photoelectric conversion efficiency is related to an absorption spectrum range of the photosensitive active layer 61.

In some exemplary embodiments, the display substrate may be a white light organic electroluminescent diode (WOLED) display substrate, in which each light-emitting element emits white light, and an organic functional layer of all light-emitting elements is a shared layer, and the organic functional layer may include a red light-emitting layer, a green light-emitting layer and a blue light-emitting layer which are stacked. A light detection unit is disposed on the light-emitting element, and the display substrate may also include a color filter layer disposed on a side of the light detection unit away from the substrate. A material of a photosensitive active layer of the light detection unit may be a mixed material system of a red light absorption material, a green light absorption material and a blue light absorption material, or a single material system with strong absorption intensity at the entire visible light band of 380 to 780 nm.

An embodiment of the present disclosure provides a preparation method for a display substrate, including: forming a drive structure layer on a substrate, wherein the drive structure layer includes a pixel drive circuit; forming a light-emitting element on the drive structure layer, wherein the light-emitting element includes a first electrode, an organic functional layer and a second electrode which are stacked on the drive structure layer, and the first electrode is connected with the pixel drive circuit; and forming a light detection unit on the light-emitting element, wherein the light detection unit is configured to detect brightness of the light-emitting element, and the light detection unit includes a third electrode, a photosensitive active layer and a fourth electrode which are stacked.

In some exemplary embodiments, the third electrode is connected with the second electrode.

In some exemplary embodiments, the second electrode and the third electrode are an integrated structure, and the forming the light detection unit on the light-emitting element includes: forming the photosensitive active layer on the second electrode and forming the fourth electrode on the photosensitive active layer.

In some exemplary embodiments, the display substrate further includes a capping layer, and the forming the light detection unit on the light-emitting element includes: forming the capping layer on the second electrode, wherein the capping layer is provided with a via; forming the third electrode on the capping layer, wherein the third electrode is connected with the second electrode through the via opened on the capping layer; forming the photosensitive active layer on the third electrode; and forming the fourth electrode on the photosensitive active layer.

In some exemplary embodiments, the display substrate further includes a capping layer, and the forming the light detection unit on the light-emitting element includes: forming the capping layer on the second electrode; forming the third electrode on the capping layer, wherein the third electrode is connected with a low voltage line in a peripheral region of the display substrate; forming the photosensitive active layer on the third electrode; and forming the fourth electrode on the photosensitive active layer.

An embodiment of the present disclosure provides a brightness compensation method for a display substrate, wherein the display substrate includes multiple display regions, and the method includes: collecting brightness information of each display region; and comparing the brightness information of the multiple display regions, and compensate brightness of a corresponding display region according to a comparison result.

In some exemplary embodiments, the collecting the brightness information of each display region includes: starting to collect the brightness information of each display region according to a set time interval (for example one day, two days or one week, etc.) between two brightness compensations or according to an instruction.

In some exemplary embodiments, the collecting the brightness information of each display region includes: setting a picture displayed by the display substrate to be a monochrome picture (that is, a picture displayed when only red sub-pixels or green sub-pixels or blue sub-pixels emit light), and then collecting brightness information of multiple pixel units in each display region. In an example of the present embodiment, the pixel unit includes three sub-pixels that emit red light, green light and blue light respectively. For example, when the picture displayed by the display substrate is set to be a monochrome picture displayed when the red sub-pixels emit light, only the red sub-pixels on the display substrate emit light, and neither the green sub-pixels nor the blue sub-pixels emit light. At this time, the collected brightness information of a particular pixel unit is also the brightness information of the red sub-pixel of the pixel unit. In an example of the present embodiment, the number of pixel units collected at each collecting position in each display region may be the same, for example, the luminous brightness of one corresponding pixel unit is collected at each collecting position in each display region.

In some exemplary embodiments, the comparing the brightness information of the multiple display regions and compensating the brightness of a corresponding display region according to the comparison result includes: calculating an average value of brightness of the multiple pixel units in each display region to obtain average brightness of the pixel units in each display region; and comparing the average brightness of the pixel units in the multiple display regions, and compensating the brightness of the corresponding display region in the monochrome picture according to the comparison result. For example, when the picture displayed by the display substrate is set to be a monochrome picture displayed when the red sub-pixels emit light, the brightness of the red sub-pixels in the corresponding display region is compensated.

In an example of the present embodiment, the brightness compensation method for the display substrate of the present embodiment will be described with reference to the display substrate shown in FIG. 1. As shown in FIG. 1, the display substrate is a foldable display substrate, including a first display region 101, a second display region 102, and a bending region 103 located between the first display region 101 and the second display region 102. The first display region 101 may be a main screen region (in use state when a foldable display product is unfolded and folded), and the second display region 102 may be a secondary screen region (in use state only when the foldable display product is unfolded). Due to different frequencies of use of different consumers for the main screen (the first display region 101) and the secondary screen (the second display region 102), the brightness attenuation of the main screen and the secondary screen becomes different, and the brightness difference between the main screen and the secondary screen is obvious in an unfolded screen state, which seriously affects the display effect in the unfolded screen state. Therefore, it is needed to compensate the brightness difference between the first display region 101 and the second display region 102. In an example, within the first display region 101, nine light detection units 6 are disposed and configured to respectively detect brightness of pixel units P at nine corresponding positions, that is, one light detection unit 6 detects brightness of a pixel unit P at one corresponding position. Within the second display region 102, six light detection units 6 are disposed and configured to respectively detect brightness of pixel units P at six corresponding positions, that is, one light detection unit 6 detects brightness of a pixel unit P at one corresponding position. The pixel unit P includes four sub-pixels, which are a first sub-pixel P1 emitting red light, a second sub-pixel P2 and a third sub-pixel P3 emitting green light, and a fourth sub-pixel P4 emitting blue light, respectively. In the present example, the brightness compensation method for the display substrate includes the following acts.

At S1, the picture displayed by the display substrate is set to be a monochrome picture displayed when red sub-pixels emit light, then the nine light detection units 6 disposed in the first display region 101 respectively detect brightness of pixel units P at nine positions, that is, one light detection unit 6 detects brightness of a pixel unit P at one corresponding position, and an average value of the brightness of the nine pixel units P detected by the nine light detection units 6 is calculated to obtain average brightness L1 of pixel units P in the first display region 101. Similarly, average brightness L2 of pixel units P of the second display region 102 is obtained.

At S2, The average brightness L1 of the pixel units P in the first display region 101 is compared with the average brightness L2 of the pixel units P in the second display region 102, the brightness of the red sub-pixels in the first display region 101 or/and the second display region 102 may be compensated according to a difference between L1 and L2, so that the brightness of the red sub-pixels in the first display region 101 and the brightness of the red sub-pixels in the second display region 102 reach the same target brightness.

The above S1-S2 shows the brightness compensation method for the red sub-pixels in the first display region 101 and the second display region 102. Similarly, the brightness of green sub-pixels and blue sub-pixels in the first display region 101 and the second display region 102 are compensated by using the same method respectively.

In some exemplary embodiments, the collecting the brightness information of each display region includes: setting a picture displayed by the display substrate to be a monochrome picture, and then collecting brightness information of sub-pixels of a corresponding color at multiple positions in each display region in the monochrome picture. For example, if only the red sub-pixels emit light in the monochrome picture, the brightness of the red sub-pixels is collected.

In some exemplary embodiments, the comparing the brightness information of the multiple display regions and compensating the brightness of a corresponding display region according to the comparison result includes: calculating an average value of brightness of sub-pixels of the corresponding color at multiple positions in each display region to obtain average brightness of the sub-pixels of the corresponding color in each display region; comparing the average brightness of sub-pixels of the corresponding color in the multiple display regions, and compensating the brightness of the corresponding display region in the monochrome picture according to the comparison result.

In an example of the present embodiment, the brightness compensation method for the display substrate of the present embodiment will be described with reference to the display substrate shown in FIG. 14. As shown in FIG. 14, the display substrate is a foldable display substrate. In an example, within the first display region 101, nine groups of light detection units are disposed, including nine first light detection units 601 for detecting luminous brightness of red sub-pixels, nine second light detection units 602 for detecting luminous brightness of green sub-pixels and nine third light detection units 603 for detecting luminous brightness of blue sub-pixels. Within the second display region 102, six groups of light detection units are disposed, including six first light detection units 601 for detecting luminous brightness of red sub-pixels, six second light detection units 602 for detecting luminous brightness of green sub-pixels and six third light detection units 603 for detecting luminous brightness of blue sub-pixels. In the present example, the brightness compensation method for the display substrate includes the following acts.

At S1, a picture displayed by the display substrate is set to be a monochrome picture displayed when only red sub-pixels emit light, and then the nine first light detection units 601 disposed in the first display region 101 detect luminous brightness of red sub-pixels at nine positions respectively, that is, one light detection unit 601 detects luminous brightness of a red sub-pixel at one corresponding position, and an average value of brightness of the nine red sub-pixels detected by the nine first light detection units 601 is calculated to obtain average brightness R1 of the red sub-pixels in the first display region 101. Similarly, average brightness R2 of the red sub-pixels in the second display region 102 is obtained.

At S2, the average brightness R1 of the red sub-pixels in the first display region 101 is compared with the average brightness R2 of the red sub-pixels in the second display region 102. the brightness of the red sub-pixels in the first display region 101 or/and the second display region 102 may be compensated according to a difference between R1 and R2, so that the brightness of the red sub-pixels in the first display region 101 and the brightness of the red sub-pixels in the second display region 102 reach the same target brightness.

The above S1-S2 shows the brightness compensation method for the red sub-pixels in the first display region 101 and the second display region 102. Similarly, brightness of green sub-pixels and blue sub-pixels in the first display region 101 and the second display region 102 are compensated by the same method respectively.

An embodiment of the present disclosure provides a display apparatus, including the display substrate described above. The display apparatus may be: any product or component with a display function, such as a mobile phone, a tablet computer, a television, a laptop computer, a digital photo frame, or a navigator.

Although the implementations of the present disclosure are disclosed above, the contents are only implementations for easily understanding the present disclosure and not intended to limit the present disclosure. Those skilled in the art may make any modifications and variations to implementation forms and details without departing from the spirit and scope disclosed by the present disclosure. However, the scope of patent protection of the present disclosure should still be subject to the scope defined by the appended claims.

The invention claimed is:

1. A display substrate, comprising: a drive structure layer disposed on a substrate, a light-emitting element disposed on the drive structure layer, and a light detection unit disposed on the light-emitting element; wherein the light detection unit is disposed in a direction of light emitting of the light emitting element to detect brightness of the light emitting element
wherein the drive structure layer comprises a pixel drive circuit, the light-emitting element comprises a first electrode, an organic functional layer and a second electrode which are stacked on the drive structure layer, and the first electrode is connected with the pixel drive circuit; and
the light detection unit comprises a third electrode, a photosensitive active layer and a fourth electrode which are stacked;
the display substrate further comprising: a capping layer disposed between the second electrode and the third electrode;
wherein the third electrode of the light detection unit is disposed on the capping layer, wherein the third electrode of the light detection unit is an integrated structure for different pixel units and connected with a low voltage line in a peripheral region of the display substrate.

2. The display substrate according to claim 1, wherein the second electrode shares the integrated structure for different pixel units with the third electrode.

3. The display substrate according to claim 1, further comprising: a plurality of pixel units arranged in an array, wherein a pixel unit comprises a plurality of sub-pixels, and within regions where some pixel units are located, the light detection unit is disposed.

4. The display substrate according to claim 3, wherein each of orthographic projections of the photosensitive active layer, the third electrode and the fourth electrode on the substrate comprises orthographic projections of effective light-emitting regions of all sub-pixels in a pixel unit on the substrate, and the photosensitive active layer in a region where the pixel unit is located is an integrated structure.

5. The display substrate according to claim 4, wherein fourth electrodes in regions where different pixel units are located are separated from each other.

6. The display substrate according to claim 3, wherein within a region where each sub-pixel of a pixel unit is located, the light detection unit is disposed, and photosensitive active layers in regions where sub-pixels of different colors of the pixel unit are located are separated from each other and made of different materials.

7. The display substrate according to claim 6, wherein orthographic projections of the photosensitive active layers, third electrodes and fourth electrodes in the regions where the sub-pixels of different colors are located on the substrate all comprise orthographic projections of effective light-emitting regions of corresponding sub-pixels on the substrate.

8. The display substrate according to claim 7, wherein the fourth electrodes in the regions where the sub-pixels of different colors of the pixel unit are located are separated from each other.

9. The display substrate according to claim 1, wherein the substrate is made of a flexible material, and a plurality of display regions and a bending region between two adjacent display regions are disposed on the substrate, wherein the bending region is configured to be in a bent state when the display substrate is in a folded state, and within each display region, three to twelve light detection units are disposed.

10. The display substrate according to claim 3, wherein an orthographic projection of the photosensitive active layer on the substrate comprises orthographic projections of effective light-emitting regions of all sub-pixels of a pixel unit on the substrate, and overlaps with or does not overlap with orthographic projections of effective light-emitting regions of sub-pixels of other pixel units on the substrate.

11. The display substrate according to claim 1, wherein the first electrode is a transparent material, and materials of the second electrode, the third electrode and the fourth electrode are transparent or semitransparent materials.

12. A display apparatus, comprising the display substrate according claim 1.

13. A preparation method for a display substrate, comprising:
forming a drive structure layer on a substrate, wherein the drive structure layer comprises a pixel drive circuit;
forming a light-emitting element on the drive structure layer, wherein the light-emitting element comprises a first electrode, an organic functional layer and a second electrode which are stacked on the drive structure layer, and the first electrode is connected with the pixel drive circuit; and
forming a light detection unit on the light-emitting element wherein the light detection unit is disposed in a direction of light-emitting of the light-emitting element, to detect brightness of the light-emitting element, and the light detection unit comprises a third electrode, a photosensitive active layer and a fourth electrode which are stacked;
wherein the display substrate further comprises a capping layer, and forming the light detection unit on the light-emitting element comprises:
forming the capping layer on the second electrode;
forming the third electrode of the light detection unit on the capping layer, wherein the third electrode of the light detection unit is an integrated structure for different pixel units and connected with a low voltage line in a peripheral region of the display substrate;
forming the photosensitive active layer on the third electrode; and
forming the fourth electrode on the photosensitive active layer.

14. The preparation method for the display substrate according to claim 13, wherein the second electrode shares the integrated structure for different pixel units with the third electrode, and the forming the light detection unit on the light-emitting element comprises: forming the photosensitive active layer on the second electrode and forming the fourth electrode on the photosensitive active layer.

15. A brightness compensation method for a display substrate comprising a plurality of display regions, wherein the display substrate comprises: a drive structure layer disposed on a substrate, a light-emitting element disposed on the drive structure layer, and a light detection unit disposed on the light-emitting element wherein the light detection unit disposed in the direction of light emitting of the light emitting element to detect brightness of the light emitting element;
- wherein the drive structure layer comprises a pixel drive circuit, the light-emitting element comprises a first electrode, an organic functional layer and a second electrode which are stacked on the drive structure layer, and the first electrode is connected with the pixel drive circuit; and
- the light detection unit comprises a third electrode, a photosensitive active layer and a fourth electrode which are stacked;
- the display substrate further comprising: a capping layer disposed between the second electrode and the third electrode;
- wherein the third electrode of the light detection unit is disposed on the capping layer, wherein the third electrode of the light detection unit is an integrated structure for different pixel units and connected with a low voltage line in a peripheral region of the display substrate;

wherein the method comprises:
- collecting brightness information of each display region; and
- comparing the brightness information of the plurality of display regions, and compensating brightness of a corresponding display region according to a comparison result.

16. The brightness compensation method for the display substrate according to claim 15, wherein,
- the collecting the brightness information of each display region comprises: setting a picture displayed by the display substrate to be a monochrome picture, and then collecting brightness information of a plurality of pixel units in each display region.

17. The brightness compensation method for the display substrate according to claim 16, wherein the comparing the brightness information of the plurality of display regions and compensating the brightness of a corresponding display region according to the comparison result comprises:
- calculating an average value of brightness of the plurality of pixel units in each display region to obtain average brightness of the pixel units in each display region; and
- comparing the average brightness of the pixel units in the plurality of display regions, and compensating the brightness of a corresponding display region in the monochrome picture according to the comparison result.

* * * * *